United States Patent
Carlo Rodriguez et al.

(10) Patent No.: US 12,510,910 B2
(45) Date of Patent: Dec. 30, 2025

(54) ADAPTIVE GAIN FOR COMPENSATION IN A DIGITAL VOLTAGE REGULATOR

(71) Applicant: Intel Corporation, Santa Clara, CA (US)

(72) Inventors: Sergio Carlo Rodriguez, Hillsboro, OR (US); Cary D Renzema, North Plains, OR (US); Amit K. Jain, Sherwood, OR (US); Po-Cheng Chen, Tigard, OR (US); Fabrice Paillet, Portland, OR (US); Anand Ramasundar, Portland, OR (US); James Keith Hodgson, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 209 days.

(21) Appl. No.: 17/540,046

(22) Filed: Dec. 1, 2021

(65) Prior Publication Data

US 2023/0168705 A1  Jun. 1, 2023

(51) Int. Cl.
*G05F 1/577* (2006.01)
*G05F 1/10* (2006.01)

(52) U.S. Cl.
CPC .............. *G05F 1/577* (2013.01); *G05F 1/10* (2013.01)

(58) Field of Classification Search
CPC . G05F 1/577; G05F 1/575; G05F 1/59; G05F 1/10; G05F 1/595; H03K 19/0005; H03K 19/017509; H03K 19/017545; H03K 19/018557; H03K 17/002; H03K 17/007; H03K 17/6871; H03K 17/687; H03K 17/6872
See application file for complete search history.

(56) References Cited

U.S. PATENT DOCUMENTS 10,224,944 B2 * 3/2019 Salem ................. H03M 1/0617
10,635,124 B2   4/2020 Mahajan et al.

OTHER PUBLICATIONS

European Search Report and Search Opinion, EP App. No. 22204919.9, Apr. 24, 2023, 14 pages.
Muthukaruppan, et al., "A Digitally Controlled Linear Regulator for Per-Core Wide-Range DVFS of Atom Cores in 14nm Tri-Gate CMOS Featuring Non-Linear Control, Adaptive Gain and Code Roaming", ESSCIRC 2017, 43rd IEEE European Solid State Circuits Conference, Sep. 11, 2017, pp. 275-278.

* cited by examiner

*Primary Examiner* — Jung Kim
(74) *Attorney, Agent, or Firm* — NICHOLSON DE VOS WEBSTER & ELLIOTT LLP

(57) ABSTRACT

Embodiments herein relate to a feedback loop in a digital voltage regulator for controlling an output voltage. To avoid instability at light current loads, a gain of the loop is reduced as a power gate code indicates a reduced number of branches in set of current sources are enabled. In an example implementation, the code is classified into one range of a number of ranges, and the gain is set based on the one range. The gain can decrease each time the code enters a lower range, as indicated by the code crossing a threshold or predetermined value. For example, the gain can decrease by half each time the code enters a lower range.

21 Claims, 10 Drawing Sheets

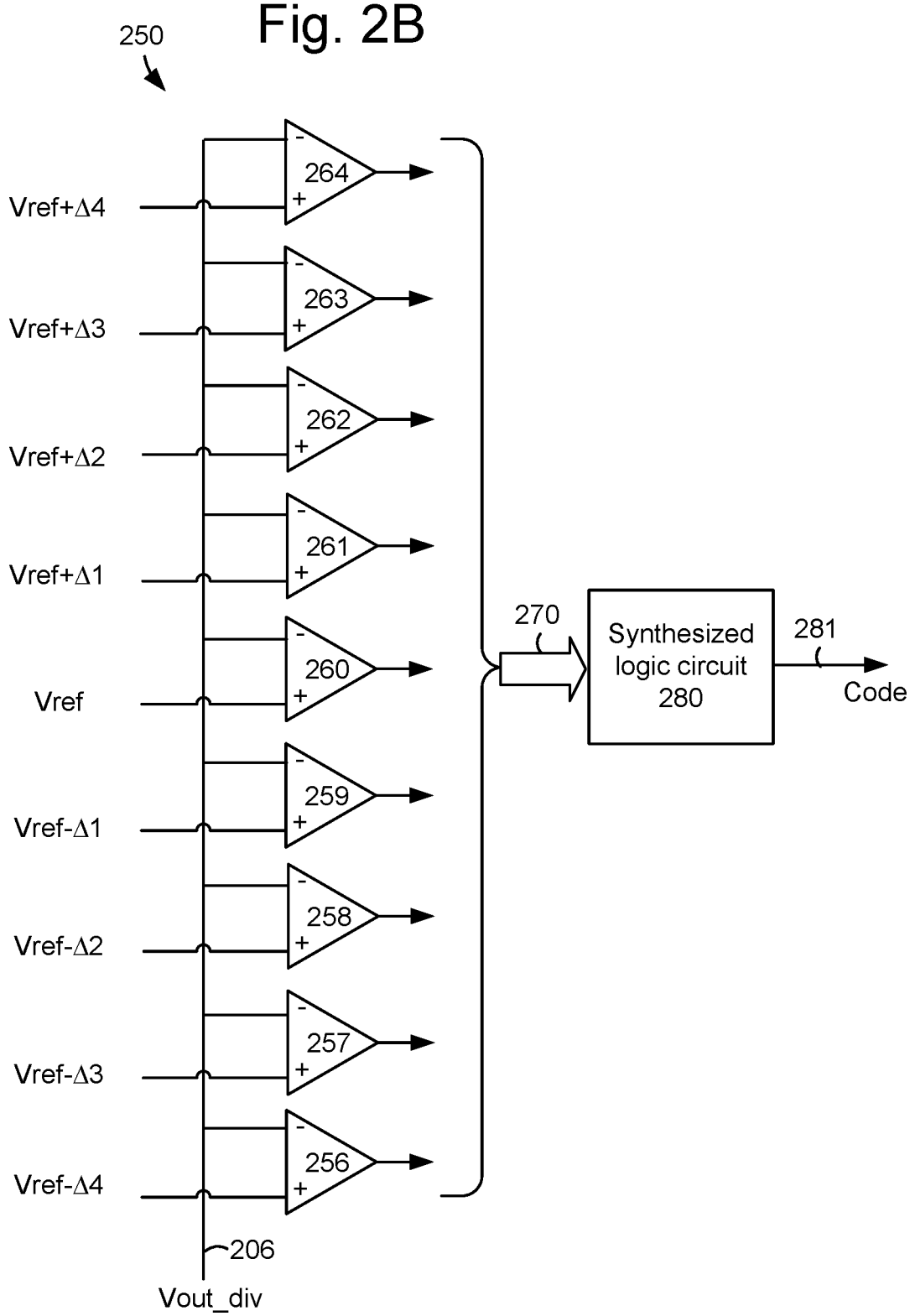

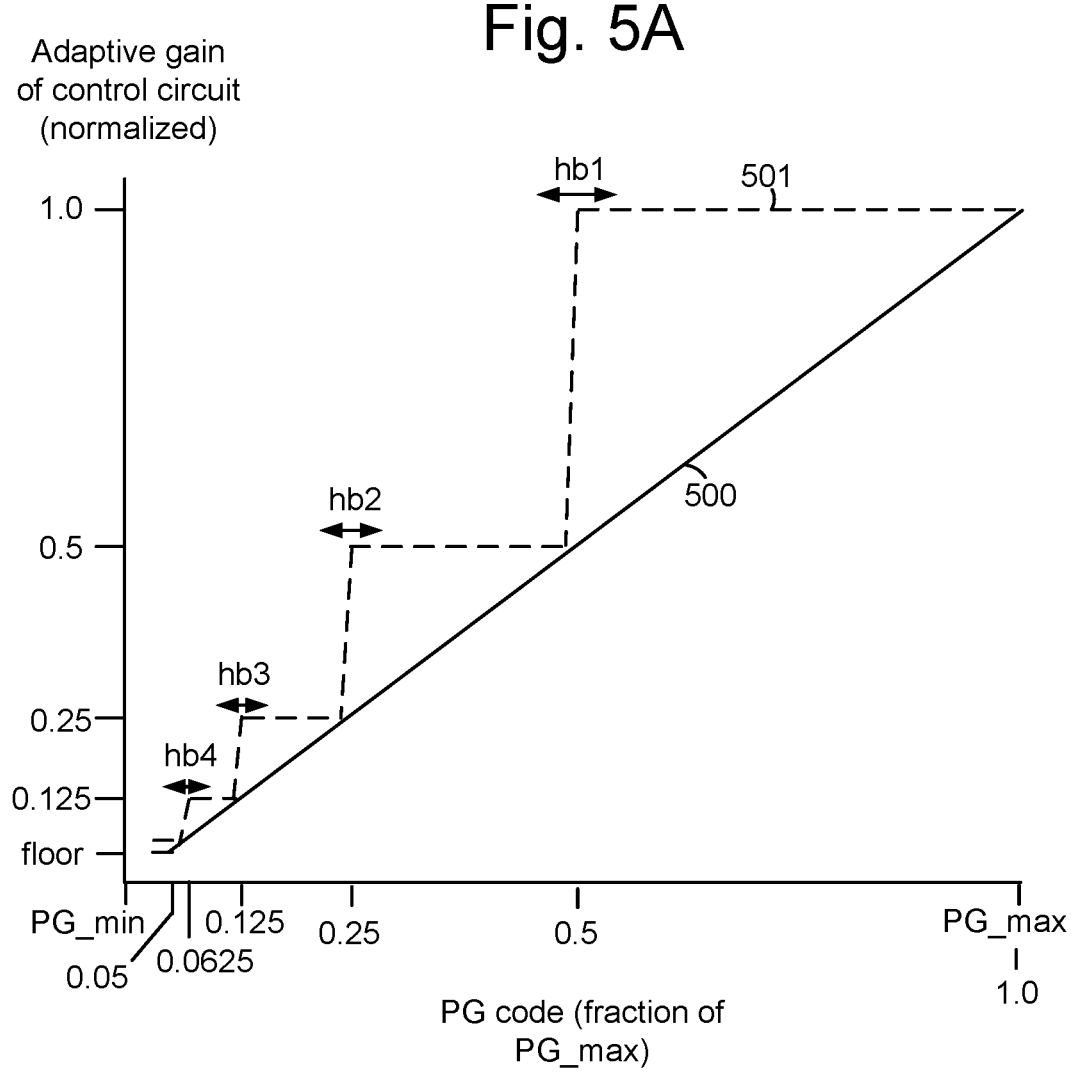

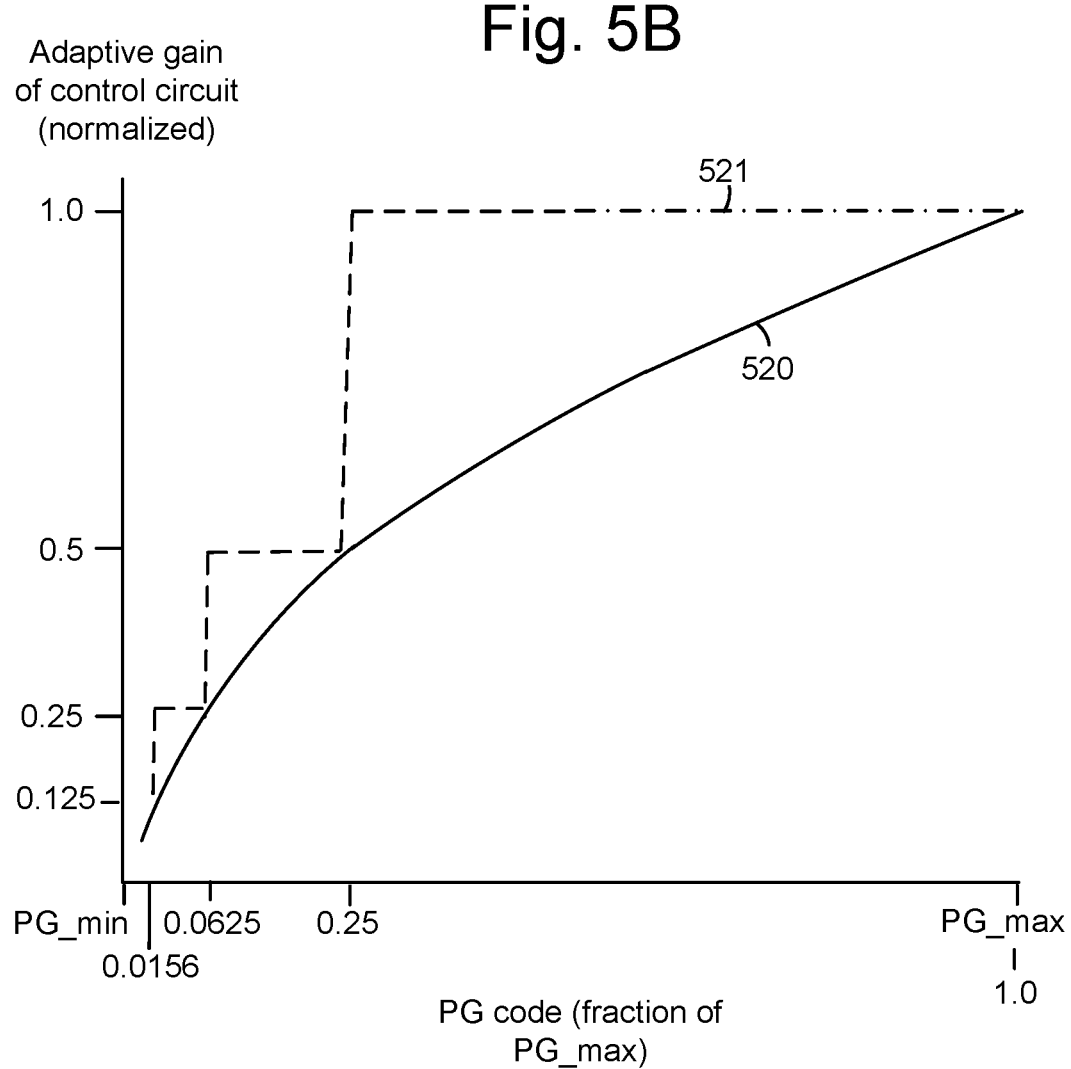

1

ADAPTIVE GAIN FOR COMPENSATION IN A DIGITAL VOLTAGE REGULATOR

FIELD

The present application generally relates to the field of voltage regulators and, more specifically, to a control circuit for a voltage regulator.

BACKGROUND

Voltage regulators have various applications such as supplying power to components in an integrated circuit. For example, a voltage regulator may be used as a computer power supply which provides a stable direct current (DC) voltage used by a processor and other components of a computer. A voltage regulator typically includes a negative feedback control loop to automatically maintain a constant output voltage regardless of changes in the input voltage and the load. The voltage regulator can be digital or analog. Moreover, voltage regulators include linear regulators and switching regulators. However, various challenges are presented in operating such voltage regulators.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 2B depicts a diagram of an example implementation of the control circuit 201 of FIG. 2A, including a voltage error detector, in the form of a flash analog-to-digital converter (ADC) 250, and a synthesized logic circuit 280, in accordance with some embodiments.

FIG. 5A depicts example plots of an adaptive gain of the control circuit 201 of FIG. 2A as a function of a code for selecting current sources in the set of current sources 210 of FIG. 2A, for the case of a continuous linear proportional function (plot 500) and a stair step approximation of the continuous linear proportional function (plot 501), in accordance with some embodiments.

FIG. 5B depicts example plots of an adaptive gain of the control circuit 201 of FIG. 2A as a function of a code for selecting current sources in the set of current sources 210 of FIG. 2A, for the case of a continuous square root function (plot 520) and a stair step approximation of the continuous square root function (plot 521), in accordance with some embodiments.

DETAILED DESCRIPTION

Figure 1:
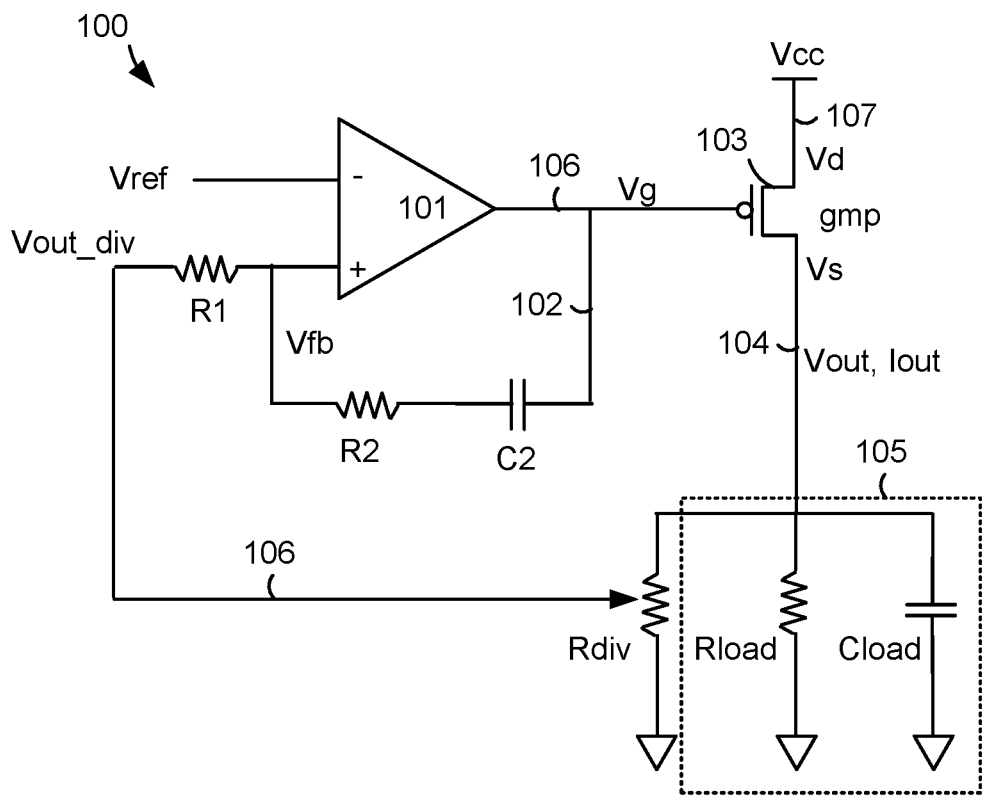
FIG. 1 depicts a diagram of an analog linear voltage regulator 100, as a comparative example.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method"

may refer to any method executed by one or more processors, a computer system having one or more processors, a mobile device such as a smartphone (which may include one or more processors), a tablet, a laptop computer, a set-top box, a gaming console, and so forth.

The terms "coupled," "communicatively coupled," along with derivatives thereof are used herein. The term "coupled" may mean two or more elements are in direct physical or electrical contact with one another, may mean that two or more elements indirectly contact each other but still cooperate or interact with each other, and/or may mean that one or more other elements are coupled or connected between the elements that are said to be coupled with each other. The term "directly coupled" may mean that two or more elements are in direct contact with one another. The term "communicatively coupled" may mean that two or more elements may be in contact with one another by a means of communication including through a wire or other interconnect connection, through a wireless communication channel or link, and/or the like.

As mentioned at the outset, voltage regulators typically include a feedback control loop to automatically maintain a constant output voltage regardless of changes in the input voltage and the load. To provide the output voltage, a set of current sources can provide an output current to a load. Each current source can comprise a single nMOS or pMOS transistor, or two or more nMOS or pMOS transistors connected in series, for example. The current sources are sometimes referred to as a power gates since their output is a function of their control gate voltage.

For example, in a digital power gate-based voltage regulator, a control circuit can generate a code word which is used to select a number of the current sources to provide a corresponding output current. However, such voltage regulators can suffer from reduced stability due to an increased output impedance at light current loads. As a result, the non-dominant pole moves to lower frequencies at the same time that the loop gain is increasing. These factors tend to push the loop toward instability.

One possible solution is to explicitly reduce the gain of the control circuit by inferring light load conditions from known operating point parameters such as a low output voltage set point or a low input voltage set point minus the output voltage set point, also known as dropout voltage. In these cases, the gain is adjusted solely based on the voltage set points rather than the load current, which is the actual primary cause of the output impedance variation. A fast, accurate current sensor could potentially be used to determine a proper gain setting. However, these are difficult to design under normal area and power constraints.

The techniques provided herein address the above and other issues. In one aspect, a digital current source such as a power gate is provided with current regulation such that the current is determined by a closed loop which keeps the current in active branches of the power gates nearly constant for all dropout voltages. Since the current in each power gate branch is known, the approximate load current can be inferred by multiplying the branch current times the number of branches enabled. Moreover, the code word (a power gate or PG code) which is used to control the power gates indicates the number of enabled branches. Accordingly, the adaptive gain mechanism can adjust the gain of the control loop based on the code.

Generally, to avoid instability at light current loads, the gain is reduced as the code indicates a reduced number of branches in the set of current sources are enabled. In an example implementation, the code is classified into one range of a plurality of ranges, and the gain is set based on the one range. The gain can decrease each time the code enters a lower range, as indicated by the code crossing a boundary between ranges. For example, the gain can decrease by half each time the code crosses below a boundary between adjacent ranges. This can be implemented efficiently using a binary shift function to reduce the gain by a factor of two, i.e., reduce the gain by half, each time a reduction is indicated by the code. The gain and the code can be continuously updated in successive clock cycles.

By reducing the gain at lower current loads, the control loop becomes more stable. Optionally, the control loop initiates pulse frequency modulation control of the power gates when the value of the code drops below a specified level.

The adaptive gain technique enables the control loop to be tuned for enhanced stability across a large range of load currents and especially at light current loads. The technique can be implemented using a single set of controller coefficients, avoiding the need for dynamically computed coefficients or a large expansion of the number of fuses. The technique avoids the need to design a parallel load that provides a minimum floor amount of (wasted) load current.

The above and other advantages are discussed further below.

FIG. 1 depicts a diagram of an analog linear voltage regulator 100, as a comparative example. The voltage regulator includes an amplifier 101 which receives a reference voltage, Vref, at an inverting input node (−). A non-inverting input node (+) receives a sum of a feedback voltage, Vfb, in a feedback path 102, and a divided down output voltage, Vout_div, on a path 106. The feedback path includes a capacitor C2 and a resistor R2. Vfb is a function of a voltage, Vg, at the output path 106 of the amplifier. Vg is provided to the control gate of a pMOS transistor 103 having a transconductance gmp. The transistor also has a drain voltage, Vd, on a path 107 which is a supply voltage Vcc, and a source voltage, Vs, on a path 104 which is an output node of the voltage regulator. gmp represents a gain of the pMOS transistor as a ratio of a change in an output current Iout on a path 104 to a change in the control gate voltage, i.e., gmp=$\Delta$Iout/$\Delta$Vg=2Iout/(Vgs−Vt), where Vgs is the gate-to-source voltage of the transistor and Vt is the threshold voltage of the transistor. Generally, transconductance is the ratio of the current change at the output to the voltage change at the input.

The load 105 can be any driven component, such as a processor in a computing device. The component is represented by a resistance Rload and a capacitance Cload. The load can change based on the activities of the processor, for instance, such as when the processor transitions from an active state to a standby state. For example, when the current Iout used by the processor decreases, Rload will increase, for a given Vout, since Vout=Iout×Rload.

A resistor divider, Rdiv, is used to provide Vout_div on the path 106. Vout_div, a divided down version of Vout, is a predetermined fraction of Vout, the output voltage of the voltage regulator.

Figure 2A:
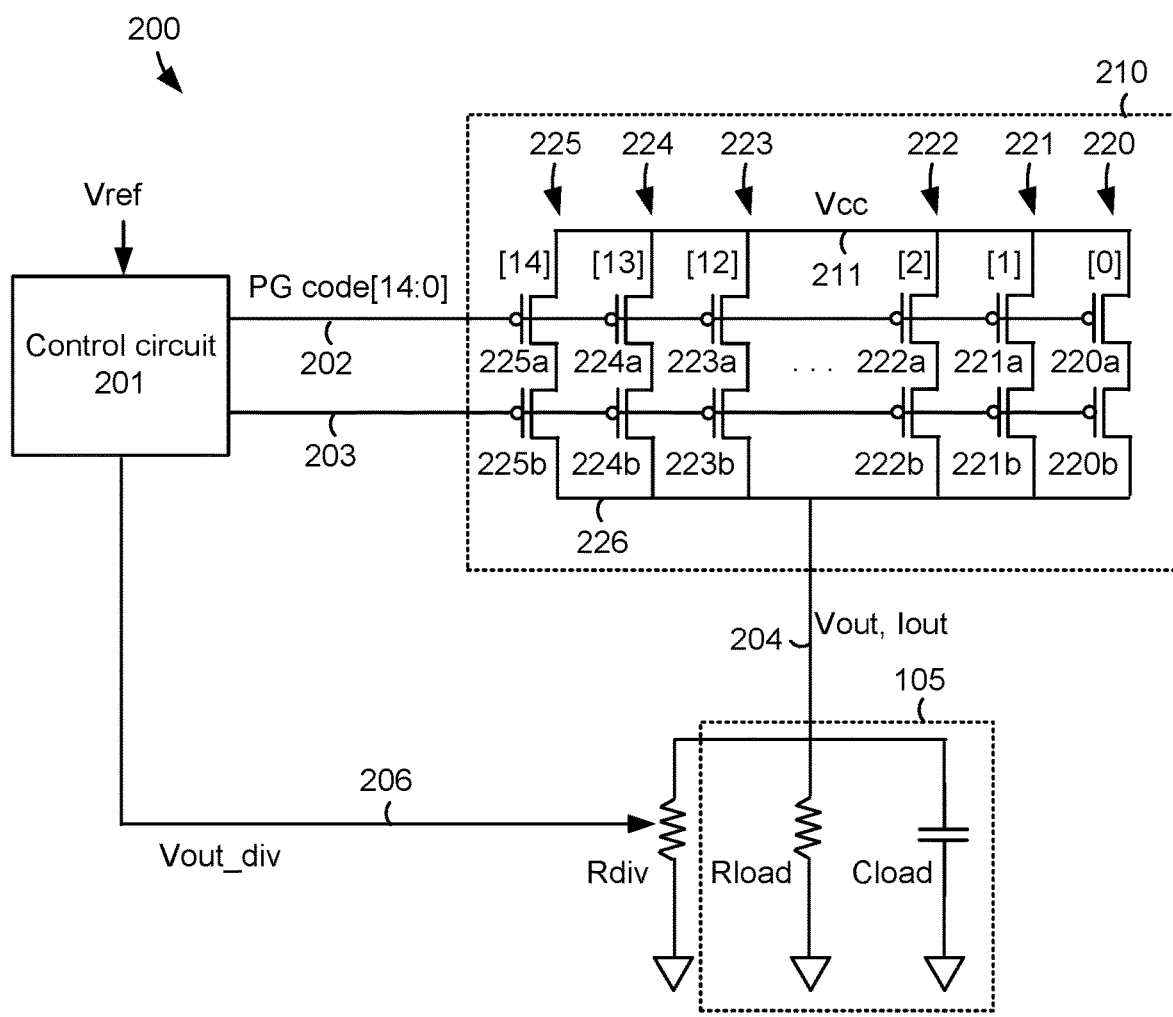
FIG. 2A depicts a diagram of a digital voltage regulator 200, in accordance with some embodiments.

FIG. 2A depicts a diagram of a digital voltage regulator 200, in accordance with some embodiments. The voltage regulator includes a set of current sources 210 including current sources 220-225. In this example, each current source includes two pMOS transistors connected in series. Generally, as mentioned, one or more nMOS or pMOS transistors connected in series can be used, in an example implementation. For example, the current source 220 includes transistors 220a and 220b, the current source 221 includes transistors 221*a* and 221*b*, the current source 222 includes transistors 222*a* and 222*b*, the current source 223 includes transistors 223*a* and 223*b*, the current source 224 includes transistors 224*a* and 224*b*, and the current source 225 includes transistors 225*a* and 225*b*. Additionally, each current source can be individually selected or enabled based on a code, PG code [14:0] which is fifteen bits in length in this example. In one approach, each bit controls a respective current source. For example, the [0], [1], [2], . . . , [12] [13] and [14] bits control the current sources 220, 221, 222, . . . , 223, 224 and 225, respectively. Each current source may have an equal strength, in one approach. In other approaches, the current sources have unequal strengths. PG code may comprise a thermometer code or a binary, for example.

PG code is provided on a path 202 to the control gates of the transistors 220*a*-225*a*. In this implementation of a digitally-selectable current source array, the signal 203 is an analog cascode bias voltage intended mostly to protect the current source from excessive over-voltage stress. The code provided on the path 202 is both the digital signal that switches the current sources on and off as well as the correct on-state analog voltage to set the current to the desired fixed level. The current sources receive a supply voltage Vcc on a supply rail 211 and provide an output voltage and current on an output rail 226 and an output path 204. The output voltage and current are provided to the load 105, as discussed in connection with FIG. 1. A path 206 provides Vout_div to the control circuit as feedback signal. The control circuit implements a feedback control loop to adjust PG code to minimize the error between Vout_div and Vref. By minimizing this error, the error in Vout is also minimized.

FIG. 2B depicts a diagram of an example implementation of the control circuit 201 of FIG. 2A, including a voltage error detector, in the form of a flash analog-to-digital converter (ADC) 250, and a synthesized logic circuit 280, in accordance with some embodiments. The voltage error detector and analog-to-digital converter includes a number of comparators 256-264. The comparators map an analog voltage error to a digital code for use by the synthesized logic circuit 280. The synthesized logic circuit is one example implementation. In general, any compute mechanism could be used to implement complex functions. A digital signal processor (DSP) could be used to compute these complex functions.

Each comparator receives Vout_div on the path 206 at an inverting input and a different reference voltage at a non-inverting input. For example, the central comparator 260 may receive Vref, which is the desired voltage to which Vout_div should equal. That is, the control circuit implements a feedback loop to have Vout_div match Vref. The comparators above the central comparator receive voltage higher than Vref while the comparators below the central comparator receive a voltage below Vref. For example, comparators 261, 262, 263 and 264 may receive Vref+$\Delta 1$, Vref+$\Delta 2$, Vref+$\Delta 3$ and Vref+$\Delta 4$, respectively, and comparators 256, 257, 258 and 259 may receive Vref-$\Delta 4$, Vref-$\Delta 3$, Vref-$\Delta 2$ and Vref-$\Delta 1$, respectively, where $\Delta 1<\Delta 2<\Delta 3<\Delta 4$. Each comparator outputs a high voltage if the reference voltage is greater than Vout_div. Otherwise, it outputs a low voltage.

The comparators can be voltage mode amplifiers in an open loop configuration, such that their output voltages are railed high or low, depending on the voltages at their inputs. Their outputs can be routed in parallel on a digital bus 270 and read in by the synthesized logic circuit 280 as a 9-bit thermometer encoded word, for example.

The error of Vout_div can therefore be classified into one category among multiple categories based on a code on the path 270. For example, in this example, there are ten categories: less than -$\Delta 4$, -$\Delta 4$ to -$\Delta 3$, -$\Delta 3$ to -$\Delta 2$, -$\Delta 2$ to -$\Delta 1$, -$\Delta 1$ to 0, 0 to $\Delta 1$, $\Delta 1$ to $\Delta 2$, $\Delta 2$ to $\Delta 3$, $\Delta 3$ to $\Delta 4$ and greater than $\Delta 4$. If Vout_div is between Vref-$\Delta 2$ and Vref-$\Delta 3$, the comparator outputs are 110000000. As another example, if Vout_div is between Vref+$\Delta 1$ and Vref+$\Delta 2$, the digital code is 111111000.

The 9-bit code on the path 270 is thus a digital error signal indicating an error of a voltage output of the plurality of current sources. A goal of the synthesized logic circuit is to implement an adaptive gain technique as discussed herein to set a gain of a control loop which minimizes this error signal. This process includes updating a code which is provided on a path 281 to current sources to provide an appropriate amount of current to minimize the error. If Vout_div<Vref, the code is increased to increase the current and if Vout_div>Vref, the code is decreased to decrease the current.

In another possible implementation, a control circuit comprises a memory device to store instructions, and a processor to execute the instructions to perform adaptive gain technique as discussed herein.

Figure 3:
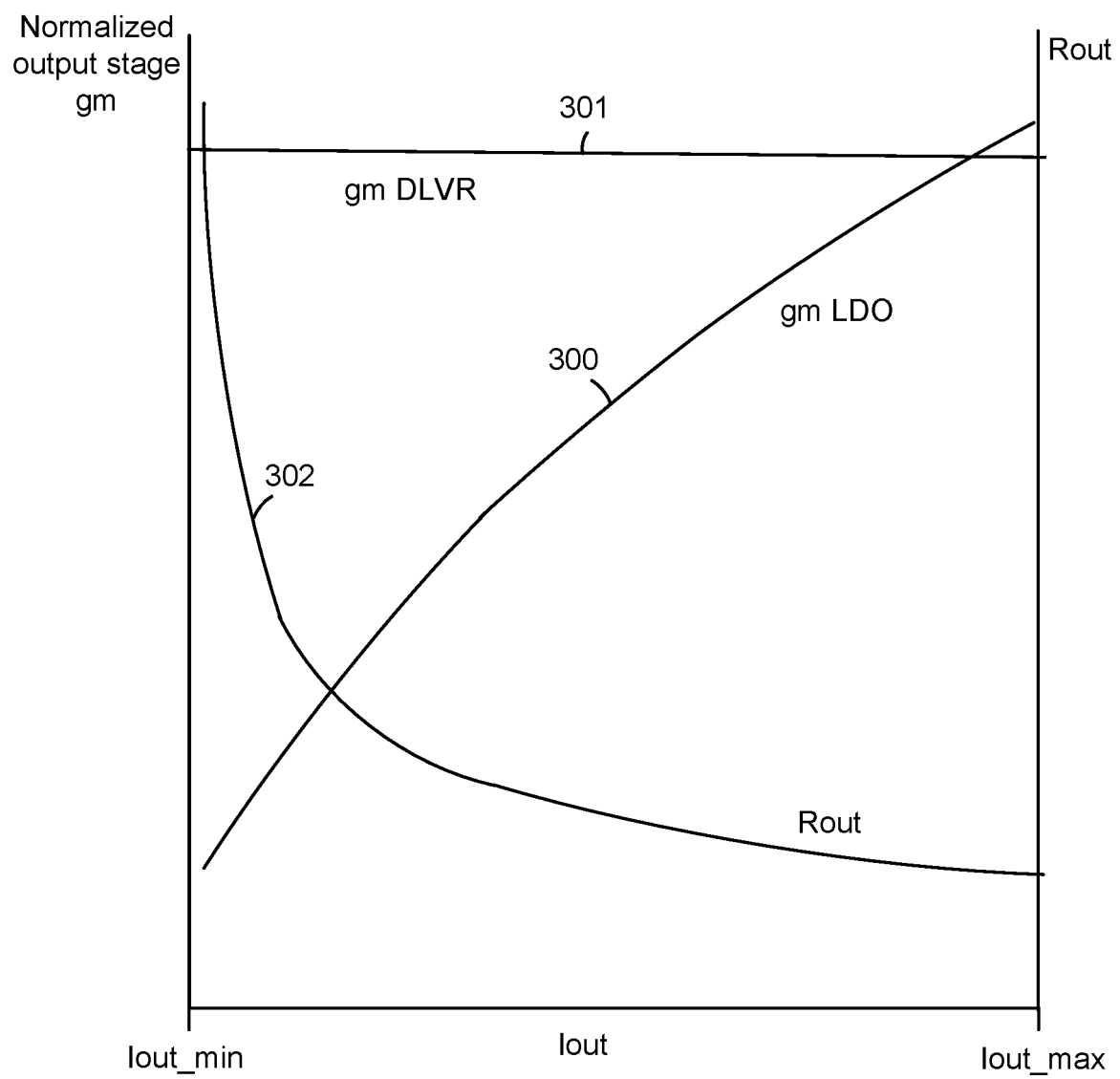
FIG. 3 depicts an example plot 300 of the normalized output stage transconductance (gm) for the analog linear voltage regulator 100 of FIG. 1, a plot 301 of the normalized output stage gm for the digital voltage regulator 200 of FIG. 2, and a plot 302 of output resistance (Rout), as a function of an output current, in accordance with some embodiments.

FIG. 3 depicts an example plot 300 of the normalized output stage transconductance (gm) for the analog linear voltage regulator 100 of FIG. 1 (referred to as a low dropout or LDO regulator), a plot 301 of the normalized output stage gm for the digital voltage regulator 200 of FIG. 2 (referred to as a digital linear voltage regulator or DLVR), and a plot 302 of output resistance (Rout), as a function of an output current, in accordance with some embodiments. The current ranges from a minimum, Iout_min, to a maximum, Iout_max. Rout is equal to Rload in parallel with the output resistance of the current sources. However, by treating them as perfect current sources with infinite output resistance, then Rout=Rload.

In particular, the plot 301 represents the normalized output stage gm for the digital voltage regulator for either a) an unregulated branch current in the presence of a static dropout voltage or b) a regulated branch current in the presence of a variable dropout voltage. That is, the gm is advantageously flat even as Iout changes for all static and dynamic input and output voltages because the current is regulated in each branch of the power gate. This is in contrast to digital regulators which have a flat gm for a given static input and output voltage, but not for dynamic input and output voltages.

Figure 4:
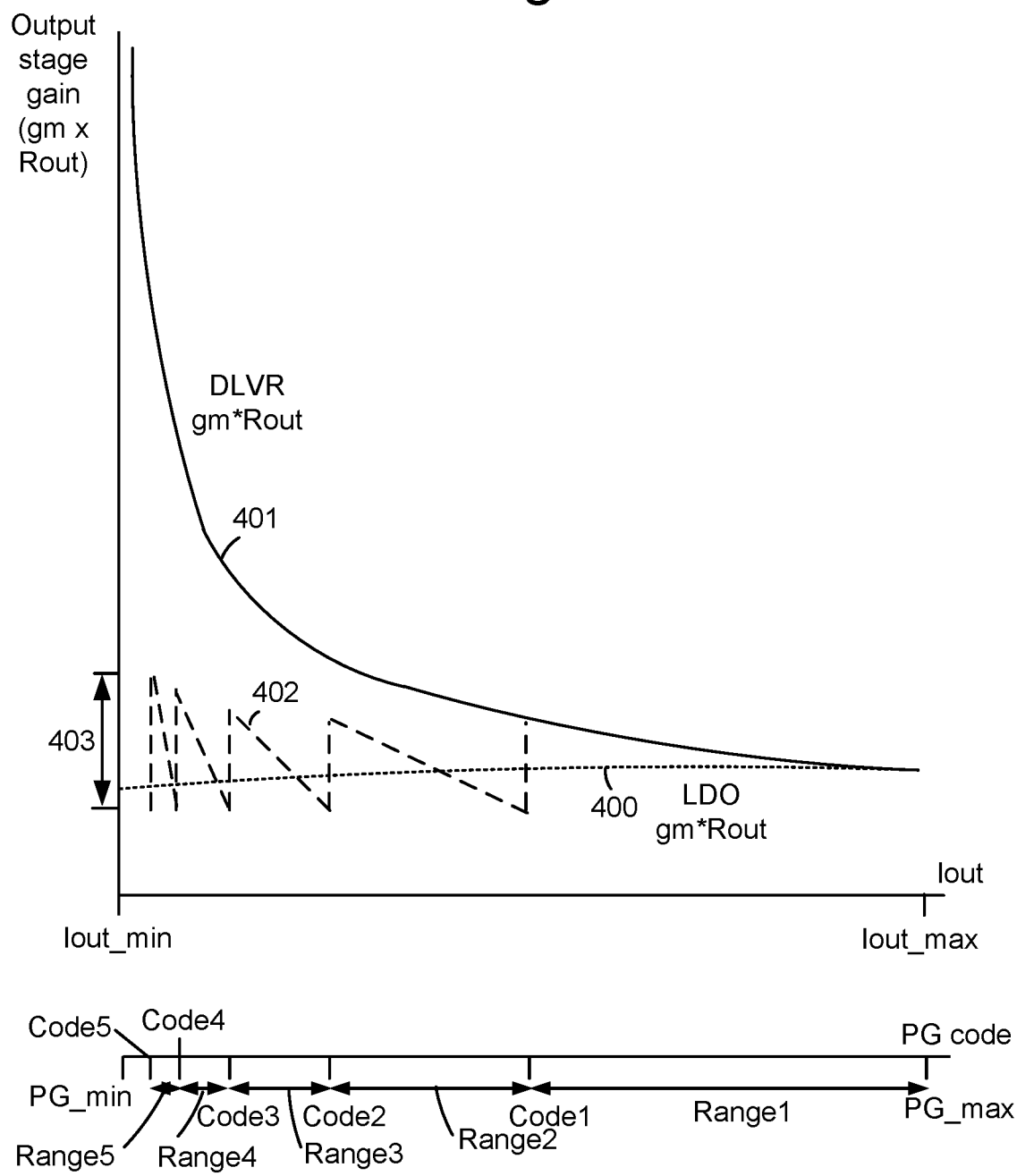
FIG. 4 depicts example plots of gm×Rout, an output stage gain, as a function of output current and PG code for the analog linear voltage regulator 100 (plot 400), the digital voltage regulator 200 without adaptive gain (plot 401), and the digital voltage regulator 200 with adaptive gain (plot 402), in accordance with some embodiments.

FIG. 4 depicts example plots of gm×Rout, an output stage gain, as a function of output current and PG code for the analog linear voltage regulator 100 (plot 400), the digital voltage regulator 200 without adaptive gain (plot 401), and the digital voltage regulator 200 with adaptive gain (plot 402), in accordance with some embodiments. As in FIG. 3, the current ranges from a minimum, Iout_min, to a maximum, Iout_max.

An additional horizontal axis depicts PG code, which corresponds to Iout. PG code ranges from a minimum, PG_min, to a maximum, PG_max and these code values correspond to Iout_min and Iout_max, respectively. Code1-Code5 are values of PG_code at boundaries between ranges of code values, e.g., Range1 from PG_max to Code1, Range2 from Code1 to Code2, Range3 from Code2 to Code3, Range4 from Code3 to Code4 and Range5 from Code4 to Code5.

The adaptive gain techniques disclosed herein are intended to stabilize a control loop of a digital voltage regulator across nearly all load conditions, specifically at light loads. To achieve this, the loop gain is reduced as the load current reduces. In one implementation, this reduction in the gain can be achieved by shifting the binary coefficients of a digital control circuit or controller as a function of the current power gate (PG) code (i.e. the amount of power gates currently enabled). Since the digital voltage regulator has current-regulated power gates, PG_code acts as a proxy for the actual load current, Iout.

The problem of light load gain is particularly challenging in digital power gate-based designs as opposed to traditional analog linear voltage regulators because the equivalent transconductance (gm) of the digital power stage is constant across load currents whereas, in analog loops, the gm reduces with load current. With reduced load current comes increased output resistance, Rout, with the product of gm and Rout being the voltage gain of the output stage of the regulator.

FIGS. 3 and 4 illustrate the difference between the analog and digital loop gms. FIG. 3 plots the gm of an analog regulator and a digital regulator as well as output resistance across load currents. In the analog loop, depicted by the plot 300, gmp (gm of the pMOS transistor) is direct function of the output current, while in the digital loop, depicted by the plot 301, gmpg (gm of the power gate) is constant across load currents because the power gate branch current is not a function of the load current. This is true since, at higher loads, the controller turns on more power gates with no change to the operating conditions of the ones that had already been on.

FIG. 4 depicts the product gm*Rout. For the analog regulator, this product is nearly flat for all load currents, as depicted the plot 400. For the digital regulator, the product again rises sharply at light loads, as depicted by the plot 401.

The adaptive gain mechanism attempts to reduce the gain of the control circuit to offset the increased gain of the output stage. An adaptive gain for the digital voltage regulator can result in the gm decreasing as current decreases, consistent with plot 300 of FIG. 3, consistent with the analog voltage regulator. The adaptive gain can therefore reduce the overall gm as a function of load current. This can be achieved by reducing the number of power gates that are enabled per PG code least significant bit (LSB). For example, at a high load of 30 A, incrementing the PG code by an LSB might turn on 50 more power gate cells. In the digital voltage regulator, this would increase the output current by 80 mA. However, at a light load of 3 A the output, resistance is 10× higher (because the load current is 10× lower). Then, the desired gain of the controller is only 5 power gate cells (or 8 mA) per LSB. In this case, the loop gain is constant for both cases because the gm and Rout changes have been cancelled.

The plot 300 represents an ideal case because the gain is continuously changing as a function of load current. However, this continuous gain scaling can be difficult to implement because the binary coefficients of the difference equation either need to be recalculated in real time, requiring a large amount of computing power, or a very large look-up table has to be defined using a large amount of memory, e.g., ROM, or fuse space.

Rather than attempt a complex implementation of the adaptive gain mechanism, one possible implementation involve defining coarse gain bins whose thresholds are defined by the PG code. As PG code decreases from the maximum value, each new discrete bin results in a 50% reduction in controller gain, for instance. The advantage of a 50% change in gain is that it is efficient to implement in the controller binary coefficients by a shift function. Within each bin, the gain will still increase as the current decreases, but a set of controller coefficients can be defined which result in the output stage gain being stable over the full range of output current.

For example, in FIG. 4, each gain bin corresponds to one of the ranges of PG code, e.g., Range1-Range5. The use of five bins and ranges is an example only. The plot 402 indicates the output stage gain increases slightly within each range of PG code but is reset to a lower level when the PG code crosses the boundary into the next lower range. The output stage gain can therefore be kept in a relatively narrow specified range as depicted by the arrow 403. The control circuit, such as the synthesized logic circuit 280, can set the gain to maintain gm×Rout within a specified range across different values of the code, where gm is the transconductance of the current sources and Rout is the output resistance of the current sources.

Note that the range of the output stage gain can still increase at lower values of PG_code since it follows the increase in the plot 401. Accordingly, to avoid an excessive increase in the output stage gain, it is possible to initiate a different control mode for the current sources such as pulse frequency modulation when PG code falls below a specified value, as discussed further below. This allows the time-averaged output current to be further reduced by mixing periods of pulsed current with variable periods of zero current, effectively reducing the output stage gain.

Figure 5C:
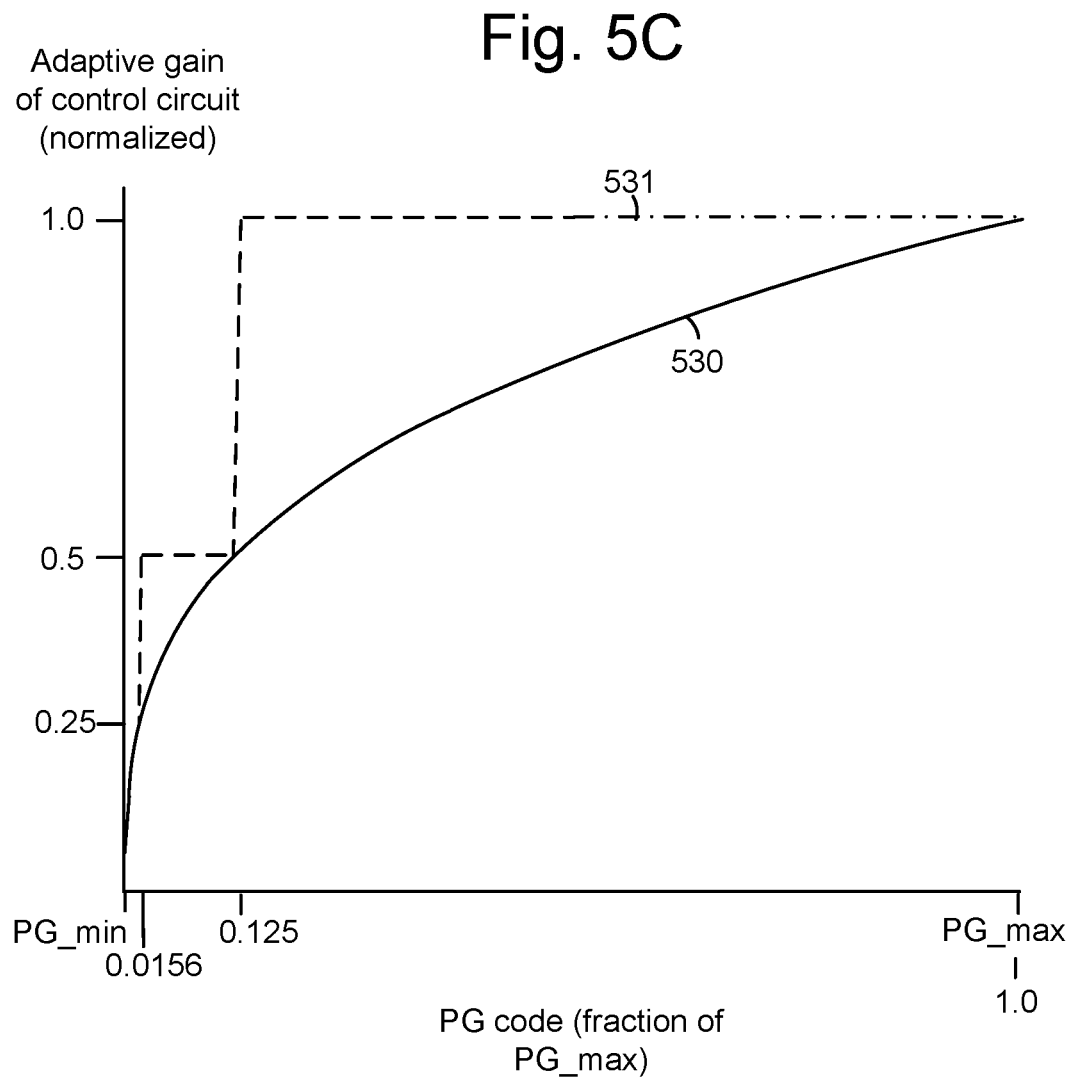
FIG. 5C depicts example plots of an adaptive gain of the control circuit 201 of FIG. 2A as a function of a code for selecting current sources in the set of current sources 210 of FIG. 2A, for the case of a continuous cube root function (plot 530) and a stair step approximation of the continuous cube root function (plot 531), in accordance with some embodiments.

FIG. 5A to 5C depicts example functions for providing an adaptive gain in the control circuit 201 of FIG. 2A as a function of PG code. Each figure depicts a continuous function and one possible discrete, stair step simplification of the continuous function. The simplified function can include step sizes which correspond to 50% reductions in the gain to allow for a simplified implementation using a binary shift function. For example, assume a code with a decimal value of 16 has the binary code 10000 and a code with a decimal value of 8, which is one half of 16, has the binary code 1000. The code 1000 can be obtained by shifting the code 10000 by one bit to omit the last 0 from the code.

FIG. 5A depicts example plots of an adaptive gain of the control circuit 201 of FIG. 2A as a function of a code for selecting current sources in the set of current sources 210 of FIG. 2A, for the case of a continuous linear proportional function (plot 500) and a stair step approximation of the continuous linear proportional function (plot 501), in accordance with some embodiments. In this example, plot 501 has a first step of 1.0 when PG_code is in a range 0.5 to 1.0, a second step of 0.5 when PG_code is in a range 0.25 to 0.5, a third step of 0.25 when PG_code is in a range 0.125 to 0.25, a fourth step of 0.125 when PG_code is in a range 0.0625 to 0.125, and a fifth step of 0.0625 when PG_code is below 0.0625. In FIG. 5A to 5C, the PG_code is represented on a scale of 0-1, as a fraction of PG_max.

The plot 500 represents a proportional variation in gain as a function of PG code since a x % reduction in PG code results in an x % reduction in controller gain. The plot 501 represents the adaptive gain in discrete bins. For example, the plot 501 is flat until the PG code reduces to half its maximum value, at which point the gain is also reduced by a factor of 0.5. The bin thresholds may be chosen arbitrarily so that gain can be modified without following any single exponential function over the entire set of PG codes. To provide an efficient implementation, a limitation can be imposed to modify the gain only in 2× increments, so care should be taken to not place bins too close together so that the gain changes too rapidly. However, other implementations are possible in which the gain changes in increments other than 2×.

Additionally, a hysteresis band can be implemented around each PG code boundary to prevent the loop from entering a non-linear limit cycle. For example, hysteresis bands hb1, hb2, hb3 and hb4 are centered about 0.5, 0.25, 0.125 and 0.0625, respectively. In this example, the range of PG_code becomes progressively smaller by a factor of 50% for each successive range. The hysteresis bands can also be progressively smaller for each successive range of PG_code. The hysteresis bands avoid frequent changes in the gain which could occur when the PG-code fluctuates around one of the boundaries of the ranges. However, other options are possible, including providing equal hysteresis bands or bands which vary in width in some other way. Hysteresis bands can also be provided in the examples of FIG. 5B to 5C.

Additionally, note the minimum level of the gain, or the gain floor, at very light loads. The floor can be implemented so that the digital controller coefficients never actually reach numerical zero in the limit as load current approaches zero. In FIG. 5A, the floor is reached at PG code=0.05*PG_max, at which point that the adaptive gain is discontinued, in one approach. Instead, to compensate for the most extreme light current load conditions, other techniques such as pulse frequency mode (PFM) can be used to control the current sources. In one approach, a control circuit initiates PFM control of the power gates when the value of the code drops below a specified level such as 0.05*PG_max.

FIG. 5B depicts example plots of an adaptive gain of the control circuit 201 of FIG. 2A as a function of a code for selecting current sources in the set of current sources 210 of FIG. 2A, for the case of a continuous square root function (plot 520) and a stair step approximation of the continuous square root function (plot 521), in accordance with some embodiments. In this example, plot 521 has a first step of 1.0 when PG_code is in a range 0.25 to 1.0, a second step of 0.5 when PG_code is in a range 0.0625 to 0.25, and a third step of 0.125 when PG_code is in a range 0.0156 to 0.0625. Each 2× reduction in gain can be implemented efficiently by shifting the code by one bit. Generally, a reduction in gain by a factor of $1/(2^y)$ can be implemented efficiently by shifting the code by y bits, where y>=1.

FIG. 5C depicts example plots of an adaptive gain of the control circuit 201 of FIG. 2A as a function of a code for selecting current sources in the set of current sources 210 of FIG. 2A, for the case of a continuous cube root function (plot 530) and a stair step approximation of the continuous cube root function (plot 531), in accordance with some embodiments. In this example, plot 531 has a first step of 1.0 when PG_code is in a range 0.125 to 1.0, a second step of 0.5 when PG_code is in a range 0.0156 to 0.125, and a third step of 0.25 when PG_code is below 0.0156.

In FIGS. 5B and 5C, a control circuit is configured to set the gain based on a stair step approximation of an nth root function of a value of the code, where n is an integer of at least two. However, any function can be used to scale the gain. For example, it need not be a root function/expression.

Figure 6:
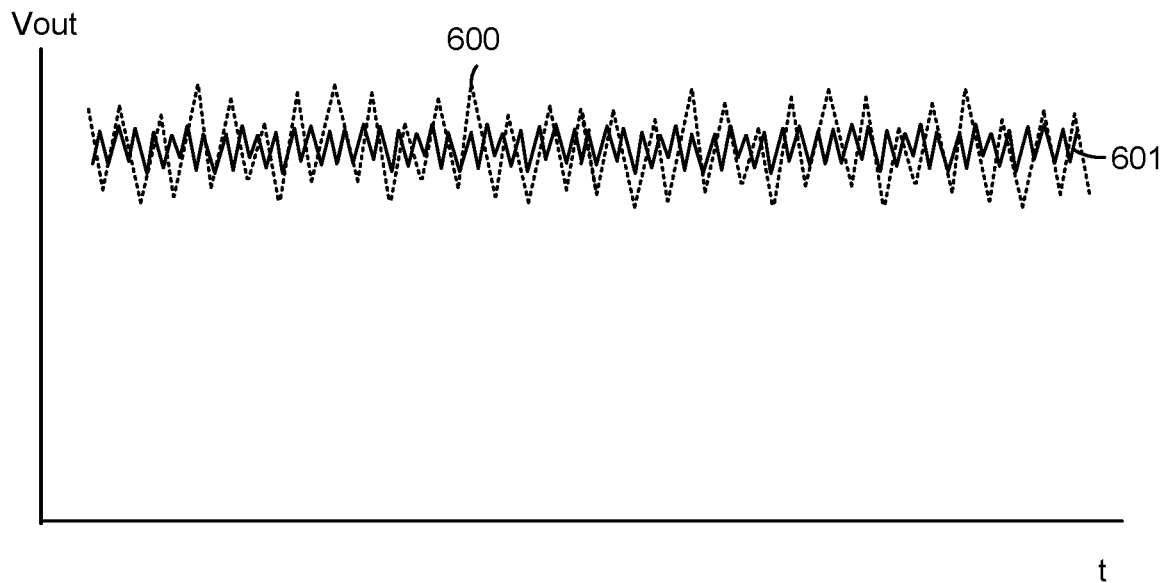
FIG. 6 depicts example plots of a voltage output, Vout, of the set of current sources 210 of FIG. 2A, for the case of no adaptive gain (plot 600) and adaptive gain (plot 601), in accordance with some embodiments.

FIG. 6 depicts example plots of a voltage output, Vout, of the set of current sources 210 of FIG. 2A, for the case of no adaptive gain (plot 600) and adaptive gain (plot 601), in accordance with some embodiments. The plots represent the case of a light current load, where the adaptive gain technique is most noticeable. The adaptive gain technique results in a significant decrease in the oscillations of Vout and maintains a quiet steady state control. During large current transients, a non-linear control technique can be used to minimize voltage droop.

Figure 7:
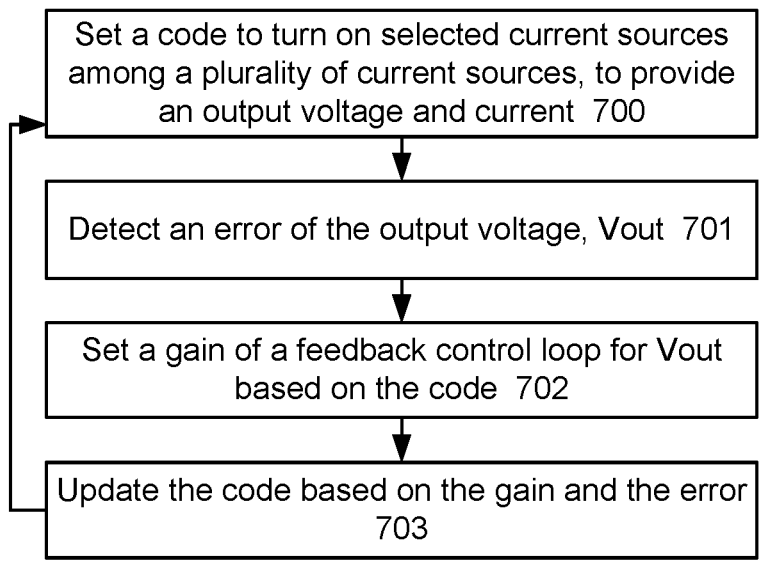
FIG. 7 depicts a flow chart of an example process for providing an adaptive gain in a feedback control loop of a voltage regular such as in FIG. 2A, in accordance with some embodiments.

FIG. 7 depicts a flow chart of an example process for providing an adaptive gain in a feedback control loop of a voltage regular such as in FIG. 2A, in accordance with some embodiments. The process can be carried out by a control circuit, for example. Step 700 includes setting a code, e.g., PG_code, to turn on selected current sources among a plurality of current sources, to provide a corresponding output voltage and current to load. Step 701 includes detecting an error of the output voltage, Vout. This can involve comparing Vout_div to Vref such as discussed in connection with FIG. 2B. Step 702 includes setting a gain of a feedback control loop for Vout based on the code. For example, this can involve the techniques of FIG. 5A to 5C. Step 703 includes updating the code based on the gain and the error.

For example, the code can be adjusted in each clock cycle as a new value of Vout_div is obtained. In an example implementation, a control circuit to implement a control loop which minimizes an error of the output voltage, wherein to implement the control loop, the control circuit updates the code in successive clock cycles based on the error and a value of the code. For example, in an nth clock cycle, the control circuit is to update the code based on a value of the code in a previous, n–1st clock cycle. Further, the control circuit is to provide a relatively small adjustment to the code in the nth clock cycle when the value of the code in the previous, n–1st clock cycle indicates the output current is relatively low.

As mentioned, the gain of the control loop can be decreased when PG_code indicates Iload is relatively low. The adjustment of the gain can be performed in different ways. In one approach, data is stored in a programmable register such as fuses which can be read by the control circuit to determine an adjustment based on PG_code. The programmable register can be programmed by hardware or software. Moreover, the adjustment can be performed on an overall gain value which comprises multiple gain components. For example, in a proportional-integral-derivative (PID) control circuit, the overall gain is based on $KP \times e[n] + KI \times \Sigma e[n] + KD \times (e[n]-e[n-1])$, where KP is a proportional gain, KI is an integral gain, KD is a derivative gain, e[n] is an error of Vref-Vout_div in a current nth clock cycle and e[n–1] is an error of Vref-Vout_div in a prior n–1st clock cycle. In theory, one could change difference equation coefficients and thus KP, KI and KD. However, this would require a more complex implementation including additional fuses. In this case, at least one of the proportional gain, integral gain or derivative gain is a function of the code.

Figure 8:
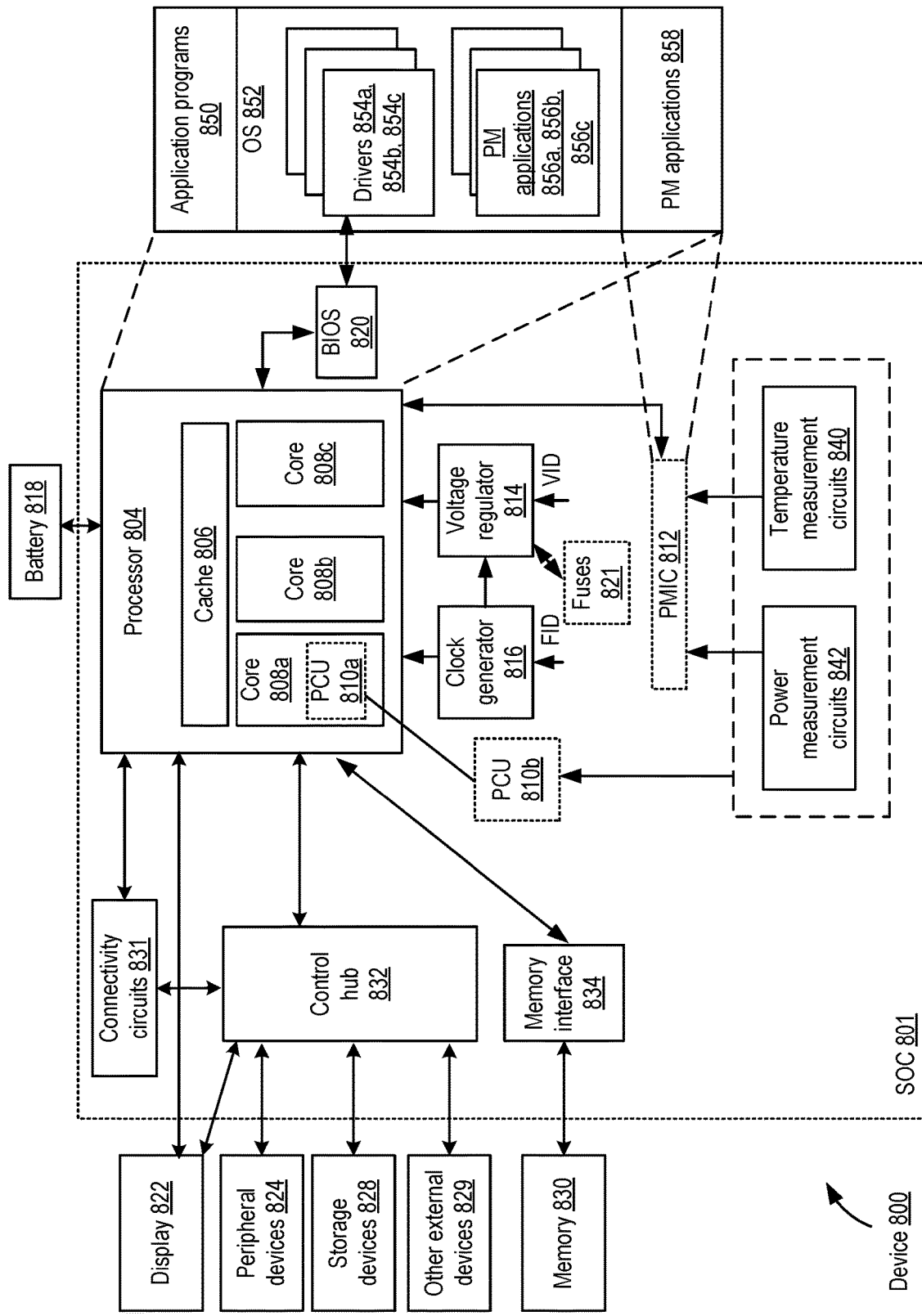
FIG. 8 illustrates a smart device or a computer system or a System-on-Chip (SoC) with apparatus and/or software in accordance with some embodiments.

Thus, in a PID control circuit PG code is equal or proportional to $KP \times e[n] + KI \times \Sigma e[n] + KD \times (e[n]-e[n-1])$, where at least one of KP, KI and KD is a function of PG code, and is relatively small when PG code indicates Iout is relatively small. In a proportional only control circuit, PG code is equal or proportional to $KP \times e[n]$. In a proportional-integral control circuit, PG code is equal or proportional to $KP \times e[n] + KI \times \Sigma e[n]$. $\Sigma e[n]$ represents a summation of errors over a specified number of previous error values/clock cycles. FIG. 8 illustrates a smart device or a computer system or a System-on-Chip (SoC) with apparatus and/or software in accordance with some embodiments. In some embodiments, device 800 represents a computing device such as a computing tablet, a mobile phone or smart-phone, a laptop, a desktop, an Internet-of-Things (JOT) device, a server, a wearable device, a set-top box, a wireless-enabled e-reader, or the like. It will be understood that certain components are shown generally, and not all components of such a device are shown in device 800.

In an example, the device 800 comprises a SoC (System-on-Chip) 801. An example boundary of the SoC 801 is illustrated using dotted lines, with some example components being illustrated to be included within the SoC.

In some embodiments, device 800 includes a processor 804. Processor 804 can include one or more physical devices, such as microprocessors, application processors, microcontrollers, programmable logic devices, or processing cores. The processing operations performed by processor 804 can include the execution of an operating platform or operating system on which applications and/or device functions are executed. The processing operations can include operations related to I/O (input/output) with a human user or with other devices, operations related to power management, operations related to connecting computing device 800 to another device. The processing operations may also include operations related to audio I/O and/or display I/O.

In some embodiments, the processor 804 includes multiple processing cores such as the example cores 808a, 808b, 808c. The cores may be implemented on a single integrated circuit (IC) chip which may include one or more shared and/or private caches, buses or interconnections, graphics and/or memory controllers, or other components.

In some embodiments, the processor 804 includes a cache 806. Sections of the cache 806 may be dedicated to individual cores or one or more sections of the cache 806 may be shared among two or more cores. The cache 806 may be split in different levels, e.g., level 1 (L1) cache, level 2 (L2) cache and level 3 (L3) cache.

In some embodiments, the processor 804 may include a fetch unit to fetch instructions from any storage devices such as the memory 830, for execution by the processor 804.

In some embodiments, the device 800 comprises connectivity circuits 831 such as hardware devices (e.g., wireless and/or wired connectors and communication hardware) and/or software components (e.g., drivers, protocol stacks), e.g., to enable the device 800 to communicate with external devices. The device 800 may be separate from the external devices, such as other computing devices, wireless access points or base stations, etc.

In some embodiments, the device 800 comprises a control hub 832, which represents hardware devices and/or software components related to interaction with one or more I/O devices. For example, the processor 804 may communicate with a display 822, peripheral devices 824, storage devices 828, and external devices 829 via the control hub 832. The control hub 832 may be a chip set, a Platform Control Hub (PCH), or the like.

The control hub 832 may connect additional devices to the device 800, e.g., through which a user might interact with the system. For example, connectivity circuits 831 may be coupled to the control hub 832, e.g., in addition to, or instead of, being coupled directly to the processor 804.

In some embodiments, the device 800 comprises a memory 830 coupled to the processor 804 via a memory interface 834. The memory 830 includes memory devices for storing information.

In some embodiments, the device 800 comprises temperature measurement circuits 840, e.g., for measuring temperature of various components of device 800. In an example, temperature measurement circuits 840 may be embedded, or coupled or attached to various components, whose temperature are to be measured and monitored. For example, temperature measurement circuits 840 may measure temperature of (or within) one or more of cores 808a, 808b, 808c, voltage regulator 814, memory 830, a mother-board of SoC 801, and/or any appropriate component of device 800.

In some embodiments, the device 800 comprises power measurement circuits 842, e.g., for measuring power consumed by one or more components of the device 800.

In some embodiments, the device 800 comprises one or more voltage regulator circuits 814, generally referred to as voltage regulators (VRs). The VRs may implement an adaptive gain technique such as discussed herein. VR 814 generates signals at appropriate voltage levels, which may be supplied to operate components of the device 800. Merely as an example, VR 814 is illustrated to be supplying signals to processor 804 of device 800. In some embodiments, VR 814 receives one or more Voltage Identification (VID) signals, and generates the voltage signal at an appropriate level, based on the VID signals. Various type of VRs may be utilized for the VR 814. For example, VR 814 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 810a/b and/or PMIC 812. In some embodiments, each core has a network of distributed LDOs to provide efficient control for power management. The LDOs can be digital, analog, or a combination of digital or analog LDOs. In some embodiments, VR 814 includes current tracking apparatus to measure current through power supply rail(s).

In some embodiments, the device 800 comprises a clock generator 816 which generates clock signals at appropriate frequency levels for any appropriate components of the device 800. Merely as an example, clock generator 816 is illustrated to be supplying clock signals to the processor 804 and the VR 814. In some embodiments, clock generator 816 receives one or more Frequency Identification (FID) signals, and generates the clock signals at an appropriate frequency, based on the FID signals. The output clock signal, outclk, is one example of a clock signal.

In some embodiments, the device 800 comprises a battery 818 supplying power to various components of the device 800 such as the processor 804.

The fuses 821 or other programmable register can be used to store data indicating a correspondence between a code and a gain such as discussed in connection with FIG. 5A to 5C. The synthesized logic circuit 280 can read the data to implement the adaptive gain techniques disclosed herein. For example, consistent with FIG. 5A, the data can include the PG_code boundary values of 0.5, 0.25, 0.125 and 0.0625 and a baseline gain corresponding to PG_code=0.5 to PG_max. The synthesized logic circuit can then implement a process to reduce the gain by 2× from the baseline value when PG_code is between 0.25 and 0.5, by 4× from the baseline value when PG_code is between 0.125 and 0.25, by 8× from the baseline value when PG_code is between 0.0625 and 0.125 and by 16× from the baseline value when PG_code is between 0.05 and 0.0625. The data can also include 0.05 as the PG_code value which triggers the PFM modulation in place of the adaptive gain technique.

In some embodiments, the device 800 comprises Power Control Units (PCUs) 810a and 810b. In an example, some sections of a PCU may be implemented by one or more processing cores 808a-808c, and these sections of the PCU are symbolically illustrated using a dotted box and labelled PCU 810a. In an example, some other sections of PCU may be implemented outside the processing cores, and these sections of PCU are symbolically illustrated using a dotted box and labelled as PCU 810b. The PCU may implement various power management operations for device 800.

In some embodiments, the device 800 comprises a Power Management Integrated Circuit (PMIC) 812, e.g., to implement various power management operations for the device 800.

In an example, the device 800 comprises the PCU and/or PMIC.

Various power management operations of device 800 may be performed by the PCU and/or by PMIC 812.

The clock generator 816 can comprise a phase locked loop (PLL), frequency locked loop (FLL), or any suitable clock source. In some embodiments, each core of processor 804 has its own clock source. The clock generator 816 can provide a clock signal to the voltage generator 814, such that the voltage generator updates a value of a code in each clock cycle of successive clock cycles for turning on current sources as discussed previously.

Also illustrated is an example software stack of device 800 (although not all elements of the software stack are illustrated). The processor 804 may execute application programs 850, Operating System 852, one or more Power Management (PM) specific application programs (e.g., generically referred to as PM applications 858). PM applications 858 may also be executed by the PCU and/or PMIC. OS 852 may also include one or more PM applications 856a, 856b, 856c. The OS 852 may also include various drivers 854a, 854b, 854c, some of which may be specific for power management purposes. In some embodiments, the device 800 may further comprise a Basic Input/output System (BIOS) 820. BIOS 820 may communicate with OS 852 via one or more of the drivers.

The techniques described herein can be performed partially or wholly by software or other instructions provided in a machine-readable storage medium (e.g., memory). The software is stored as processor-executable instructions (e.g., instructions to implement any other processes discussed herein). Instructions associated with the flowchart (and/or various embodiments) and executed to implement embodiments of the disclosed subject matter may be implemented as part of an operating system or a specific application, component, program, object, module, routine, or other sequence of instructions or organization of sequences of instructions.

The storage medium can be a tangible machine readable medium such as read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs)), among others.

The storage medium may be included, e.g., in a communication device, a computing device, a network device, a personal digital assistant, a manufacturing tool, a mobile communication device, a cellular phone, a notebook computer, a tablet, a game console, a set top box, an embedded system, a TV (television), or a personal desktop computer.

Some non-limiting examples of various embodiments are presented below.

Example 1 includes an apparatus, comprising: a plurality of current sources; and a control circuit coupled to the plurality of current sources, the control circuit to set a code to turn on selected current sources of the plurality of current sources, the plurality of current sources to provide an output current and an output voltage to a load based on the code, the control circuit to detect an error of the output voltage, set a gain of a feedback control loop for the output voltage based on the code, and update the code based on the gain and the error.

Example 2 includes the apparatus of example 1, wherein to set the gain, the control circuit is to classify the code into one range among a plurality of ranges and to set the gain based on the one range.

Example 3 includes the apparatus of example 2, wherein the plurality of ranges become progressively smaller as the code decreases in value.

Example 4 includes the apparatus of example 2 or 3, wherein hysteresis bands are associated with boundaries between adjacent ranges of the plurality of ranges; and the hysteresis bands become progressively smaller as the code decreases in value.

Example 5 includes the apparatus of any one of examples 2 to 4, wherein the control circuit is to reduce the gain according to any function each time the value of the code crosses below a boundary between the ranges. One example is to reduce the gain by half each time the value of the code crosses below a boundary between the ranges.

Example 6 includes the apparatus of any one of examples 1 to 5, wherein the control circuit is to reduce the gain according to any function time each time the value of the code crosses below a boundary between the ranges.

Example 7 includes the apparatus of any one of examples 1 to 6, wherein a decreasing value of the code corresponds to a decreasing number of the current sources turned on; and the control circuit is to decrease the gain as the value of the code decreases.

Example 8 includes the apparatus of any one of examples 1 to 7, wherein the gain is an overall gain which is a function of a proportional gain, an integral gain and a derivative gain; and at least one of the proportional gain, integral gain or derivative gain is a function of the code.

Example 9 includes the apparatus of any one of examples 1 to 8, wherein the control circuit is to set the gain based on a stair step approximation of an nth root function of a value of the code, where n is an integer of at least two.

Example 10 includes the apparatus of any one of examples 1 to 9, wherein the control circuit is to set the gain based on a stair step approximation of an n/mth root function of a value of the code, where n and m are integers and n<m.

Example 11 includes the apparatus of any one of examples 1 to 10, wherein the control circuit is to initiate pulse frequency modulation to control the plurality of current sources when a value of the code drops below a specified level.

Example 12 includes the apparatus of any one of examples 1 to 11, wherein each current source of the plurality of current sources comprises a power gate coupled to an input supply voltage node and an output supply voltage node.

Example 13 includes an apparatus comprising: programmable registers to store data indicating a correspondence between a code and a gain; and a circuit to read the data, to set a value of the gain based on a current value of the code and the correspondence between the code and the gain, and to set a new value for the code based on the value of the gain and an error signal indicating an error of a voltage output of a plurality of current sources, wherein selected current sources of the plurality of current sources are turned on based on the code.

Example 14 includes the apparatus of example 13, wherein to set the value of the gain, the circuit is to determine a range among a plurality of ranges of the code corresponding to the current value of the code.

Example 15 includes the apparatus of example 14, wherein the data comprises boundary values of the ranges.

Example 16 includes the apparatus of examples 14 or 15, wherein the plurality of ranges become progressively smaller as the code decreases in value.

Example 17 includes the apparatus of any one of examples 13 to 16, wherein a decreasing value of the code corresponds to a decreasing number of the current sources turned on; and the circuit is to set the gain to be relatively low when the current value of the code indicates a relatively low number of the current sources are turned on.

Example 18 includes the apparatus of any one of examples 13 to 17, wherein the circuit is to set the gain to maintain gm×Rout within a specified range across different values of the code; gm is a transconductance of the plurality of current sources; and Rout is an output resistance of the plurality of current sources.

Example 19 includes an apparatus comprising: a plurality of power gates; and a control circuit coupled to the plurality of power gates, the control circuit to set a code to turn on selected power gates of the plurality of power gates, the plurality of power gates to provide an output current and an output voltage to a load based on the code, and the control circuit to implement a control loop which minimizes an error of the output voltage, wherein to implement the control loop, the control circuit updates the code in successive clock cycles based on the error and a value of the code.

Example 20 includes the apparatus of example 19, wherein in an nth clock cycle, the control circuit is to update the code based on a value of the code in a previous, n−1 st clock cycle.

Example 21 includes the apparatus of example 19 or 20, wherein the control circuit is to provide a relatively small adjustment to the code in the nth clock cycle when the value of the code in the previous, n−1st clock cycle indicates the output current is relatively low.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:
a plurality of current sources; and
a control circuit coupled to the plurality of current sources, the control circuit to set a code to turn on selected current sources of the plurality of current sources, the plurality of current sources to provide an output current and an output voltage to a load based on the code, the control circuit to detect an error of the output voltage, set a gain of a feedback control loop for the output voltage based on the code, and update the code based on the gain and the error.

2. The apparatus of claim 1, wherein:
to set the gain, the control circuit is to classify the code into one range among a plurality of ranges and to set the gain based on the one range.

3. The apparatus of claim 2, wherein:
the plurality of ranges become progressively smaller as the code decreases in value.

4. The apparatus of claim 2, wherein:
hysteresis bands are associated with boundaries between adjacent ranges of the plurality of ranges; and
the hysteresis bands become progressively smaller as the code decreases in value.

5. The apparatus of claim 2, wherein:
the control circuit is to reduce the gain by half each time the value of the code crosses below a boundary between the ranges.

6. The apparatus of claim 2, wherein:
the control circuit is to reduce the gain according to any function time each time the value of the code crosses below a boundary between the ranges.

7. The apparatus of claim 1, wherein:
a decreasing value of the code corresponds to a decreasing number of the current sources turned on; and
the control circuit is to decrease the gain as the value of the code decreases.

8. The apparatus of claim 1, wherein:
the gain is an overall gain which is a function of a proportional gain, an integral gain and a derivative gain; and
at least one of the proportional gain, integral gain or derivative gain is a function of the code.

9. The apparatus of claim 1, wherein:
the control circuit is to set the gain based on a stair step approximation of an nth root function of a value of the code, where n is an integer of at least two.

10. The apparatus of claim 1, wherein:
the control circuit is to set the gain based on a stair step approximation of an n/mth root function of a value of the code, where n and m are integers and n<m.

11. The apparatus of claim 1, wherein:
the control circuit is to initiate pulse frequency modulation to control the plurality of current sources when a value of the code drops below a specified level.

12. The apparatus of claim 1, wherein:
each current source of the plurality of current sources comprises a power gate coupled to an input supply voltage node and an output supply voltage node.

13. An apparatus, comprising:
a programmable register to store data indicating a correspondence between a code and a gain; and
a circuit to read the data, to set a value of the gain based on a current value of the code and the correspondence between the code and the gain, and to set a new value for the code based on the value of the gain and an error signal indicating an error of a voltage output of a plurality of current sources, wherein selected current sources of the plurality of current sources are turned on based on the code.

14. The apparatus of claim 13, wherein:
to set the value of the gain, the circuit is to determine a range among a plurality of ranges of the code corresponding to the current value of the code.

15. The apparatus of claim 14, wherein:
the data comprises boundary values of the ranges.

16. The apparatus of claim 14, wherein:
the plurality of ranges become progressively smaller as the code decreases in value.

17. The apparatus of claim 13, wherein:
a decreasing value of the code corresponds to a decreasing number of the current sources turned on; and
the circuit is to set the gain to be relatively low when the current value of the code indicates a relatively low number of the current sources are turned on.

18. The apparatus of claim 13, wherein:
the circuit is to set the gain to maintain gm×Rout within a specified range across different values of the code;
gm is a transconductance of the plurality of current sources; and
Rout is an output resistance of the plurality of current sources.

19. An apparatus, comprising:
a plurality of power gates; and
a control circuit coupled to the plurality of power gates, the control circuit to set a code to turn on selected power gates of the plurality of power gates, the plurality of power gates to provide an output current and an output voltage to a load based on the code, and the control circuit to implement a control loop which minimizes an error of the output voltage, wherein to implement the control loop, the control circuit updates the code in successive clock cycles based on the error and a value of the code.

20. The apparatus of claim 19, wherein:
in an nth clock cycle, the control circuit is to update the code based on a value of the code in a previous, $n-1^{st}$ clock cycle.

21. The apparatus of claim 19, wherein:
the control circuit is to provide a relatively small adjustment to the code in the nth clock cycle when the value of the code in the previous, $n-1^{st}$ clock cycle indicates the output current is relatively low.

* * * * *